(12) United States Patent
Eguchi et al.

(10) Patent No.: US 11,581,030 B2
(45) Date of Patent: Feb. 14, 2023

(54) RESISTIVE MEMORY WITH ADJUSTABLE WRITE PARAMETER

(71) Applicant: NXP USA, INC., Austin, TX (US)

(72) Inventors: Richard Eguchi, Austin, TX (US); Anirban Roy, Austin, TX (US); Jacob T. Williams, Austin, TX (US); Melvin Guison Mangibin, Austin, TX (US)

(73) Assignee: NXP USA, INC., Austin, TX (US)

( * ) Notice: Subject to any disclaimer, the term of this patent is extended or adjusted under 35 U.S.C. 154(b) by 84 days.

(21) Appl. No.: 16/932,984

(22) Filed: Jul. 20, 2020

(65) Prior Publication Data

US 2022/0020411 A1    Jan. 20, 2022

(51) Int. Cl.
G11C 11/16    (2006.01)

(52) U.S. Cl.
CPC ...... G11C 11/1675 (2013.01); *G11C 11/1653* (2013.01); *G11C 11/1659* (2013.01)

(58) Field of Classification Search
CPC ............ G11C 11/1659; G11C 11/1653; G11C 11/1675
USPC ....................................................... 365/158
See application file for complete search history.

(56) References Cited

U.S. PATENT DOCUMENTS

| | | | |
|---|---|---|---|
| 7,920,405 B2 | 4/2011 | Kang et al. | |
| 8,000,127 B2 * | 8/2011 | Hamilton | G11C 13/0007 365/100 |
| 9,455,014 B1 | 9/2016 | Lee et al. | |
| 9,721,637 B2 | 8/2017 | Houssameddine | |
| 10,861,545 B2 * | 12/2020 | Dalgaty | G11C 13/0061 |
| 2010/0238701 A1 * | 9/2010 | Tsukamoto | G11C 16/3413 365/226 |
| 2015/0043274 A1 * | 2/2015 | Liu | G11C 13/0069 365/163 |
| 2015/0162081 A1 * | 6/2015 | Molas | G11C 7/1078 711/105 |
| 2015/0206565 A1 * | 7/2015 | Aoki | G11C 11/1697 365/158 |
| 2016/0162185 A1 * | 6/2016 | D'Abreu | G11C 13/0069 711/103 |
| 2016/0313917 A1 * | 10/2016 | Xu | G06F 11/3485 |
| 2018/0350446 A1 * | 12/2018 | K | G11C 29/76 |
| 2019/0139590 A1 | 5/2019 | Berger et al. | |
| 2019/0278510 A1 * | 9/2019 | Kaynak | G11C 11/5628 |
| 2019/0392898 A1 * | 12/2019 | Haukness | G11C 13/0028 |
| 2020/0013445 A1 * | 1/2020 | Tzoufras | H01L 27/222 |
| 2020/0303001 A1 * | 9/2020 | Ogiwara | G11C 11/5614 |

* cited by examiner

*Primary Examiner* — Sung Il Cho (57) ABSTRACT

A memory includes an array of resistive memory cells and circuitry for setting a write parameter for improving write effectiveness to the cells of the memory array. The circuitry performs a write parameter setting routine that determines a midpoint resistance of a memory state of cells of the array and determines a write efficiency of a weak write operation to cells of the array. Based on the determined midpoint resistance and the determined write efficiency, the circuit sets a write parameter level for subsequent writes to cells of the array.

22 Claims, 6 Drawing Sheets

RESISTIVE MEMORY WITH ADJUSTABLE WRITE PARAMETER

BACKGROUND OF THE INVENTION

Field of the Invention

This invention relates to resistive memories.

Background

Resistive memories are utilized for storing data in an electronic system. One type of resistive memory includes a resistive storage element which is in either a high resistive state (HRS) or a low resistive state (LRS), depending on the logic state stored in the bit cell.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

As disclosed herein, a memory includes an array of resistive memory cells and circuitry for setting a write parameter for improving write effectiveness to the cells of the memory array. The circuitry performs a write parameter setting routine that determines a midpoint resistance of a memory state of cells of the array and determines a write efficiency of a weak write operation to cells of the array. Based on the determined midpoint resistance and the determined write efficiency, the circuit sets a write parameter level for subsequent writes to cells of the array. The memory then uses the write parameter level to write to cells of the array. In one embodiment, the write parameter is a write voltage applied to cells during a write operation. In another embodiment, the write parameter is a current applied to cells during a write operation.

With some memories, it is desirable that a write operation is performed only once to store a value to a cell of a memory. With some types of memories such as resistive memories, process variations may affect the write characteristics of a memory cell in that the write parameters of the write operation may need to be changed to improve the write efficiency of the write operation, especially if the write operation is to be performed only once to write a value to a cell.

For example, with some resistive memory cells such as MRAM cells, variations in the cross sectional area of the cell magnetic tunnel junction (MTJ) of the cell may cause the memory state resistance values of the cell (e.g. the low resistance state (LRS) resistance and the high resistance state (HRS) resistance) to change from a typical value. As described herein, "typical" with respect to a value or range is a value or range that a memory is designed to be at. If the cross-sectional area of the MTJ of a cell is higher than typical, then the LRS and HRS resistances will be lower than the typical ranges. Furthermore, a higher write current or voltage may be needed to change the write state of the cell than if the cross-sectional area was typical.

Another factor that may affect the write characteristics of an MRAM cell are variations in the thickness of the tunnel dielectric between the free and pinning layers of the cell. If the tunnel dielectric is thicker than typical, then a higher write current or voltage than typical may be needed to change the write state of the cell. Also, a thicker tunnel dielectric may cause higher than typical memory state resistances of the cell.

Variations in the resistivity of the select transistor of a memory cell in an on state can also effect write characteristics of a cell. The higher the resistance of the select transistor, the higher the write voltage needed to change the state of the memory cell.

In addition, the magnetic field interface between the dielectric layer and the magnetic layers of an MJT may affect write efficiency as well. Variations in the material properties of the dielectric layer and the magnetic layers of the MJT may cause variations in the write voltage or write current needed to change the voltage states.

Based on certain conditions of each of these factors, a write parameter can be adjusted to increase the strength of the write to compensate for the atypical factor or factors to place the memory cells in the correct memory state. However, increasing the strength of the write operation can prematurely wear out a memory cell and shorten its life. Thus, in some embodiments, it is desirable to set a write parameter at a level that is just strong enough for an effective write but minimize the wear on the cells of the write operation.

Because process variations in each of the four factors above can cause the desirable write strength to vary, determining the desirable write strength could be a complicated task to adjust the write strength due to each of the four factors. However, it has been discovered that write parameters can be set based upon a few determinations made by tests performed during a diagnostic routine. In one embodiment, by determining the midpoint resistance of a memory state of memory cells of the memory array and determining the write efficiency from a weak write operation, a level of a write parameter can be set for performing a write operation at a desired strength level without prematurely wearing out the cell. Furthermore, in some conditions, a measurement of the resistance of the select transistor can be made for selecting the correct level of the write parameter or to determine whether the memory should be discarded. As described herein, a "weak" write operation is a write operation where at least one write parameter is set such that the operation is less likely to be effective that a typical write operation.

Figure 1:
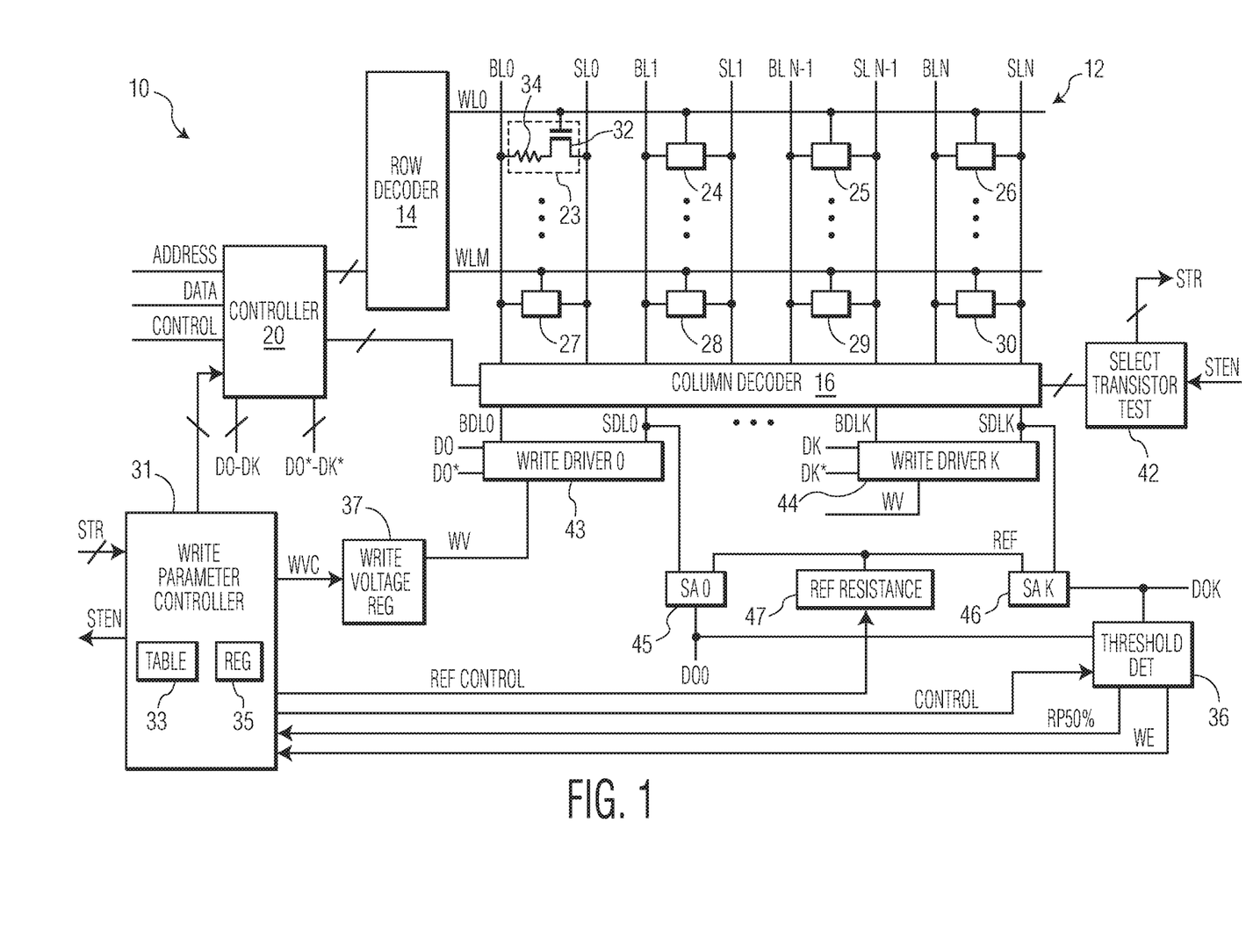
FIG. 1 is a circuit diagram of a resistive memory circuit according to one embodiment of the present invention.

FIG. 1 shows a circuit diagram of a memory circuit 10 according to one embodiment of the present invention. Memory circuit 10 includes an array 12 of resistive memory cells (e.g. 23-30). In one embodiment, the memory cells of array 12 each include a select transistor (e.g. 32) and a resistive storage element (e.g. 34). Types of resistive memory cells include, for example, MRAM, ReRAM, carbon nanotube, FeRAM, and phase change memory cells. In some embodiments, these resistive memory cells may be implemented with a magnetic tunnel junction (MTJ) where each bit cell may be described as including a select transistor (e.g. 32) and an MTJ (e.g. 34). Note that in the illustrated embodiments, the select gate transistors are N-type metal-oxide-semiconductor (NMOS) transistors. Other embodiments may implement other types of resistive memory cells which may have other configurations and/or may have other types of resistive storage structures. In some embodiments, memory circuit 10 may be coupled to a processor circuit (not shown) of an electronic system that provides data to be written in the memory and receives the read data from the memory.

The memory cells of array 12 are arranged in rows and columns. Each cell of a row is coupled to a corresponding word line (WL0-WLM) for controlling the select transistor (e.g. 32) of the cell to access the resistive storage element (e.g. 34) of the cell during a memory operation. The word lines are controlled by a row decoder 14 which asserts a selected one of the word lines based on a first portion of an address received by controller 20 of memory circuit 10 for the memory operation. Array 12 includes M+1 number of rows with 2 rows being shown in FIG. 1. However, an array may include a different number of rows in other embodiments. For example, an 8 Mb memory array may have 2048 rows plus a few (e.g., 2 or 4) redundant rows.

In the embodiment shown, the cells of each column of array 12 are coupled to a corresponding source line of source lines SL0-SLN and a corresponding bit line of bit lines BL0-BLN. Array 12 includes (N+1) source lines and (N+1) bit lines where FIG. 1 shows four source lines (e.g. SL0, SL1, SLN-1, and SLN) and four bit lines (e.g. BL0, BL1, BLN-1, and BLN). However, array 12 may have a different number of columns in other embodiments (e.g. 64, 128, 256). In other embodiments, each column of an array may include a source line paired with two bit lines, a single bit line, or different combinations of bit lines and source lines. As described herein, a "column line" may refer to either a source line or a bit line.

In the embodiment shown, memory circuit 10 includes a column decoder 16 for selecting a subset of the bit lines and source lines (SL0-SLN, BL0-BLN) to provide to write circuitry (write drivers 43 and 44) during a memory write operation and to provide to sense amplifiers (45 and 46) during a memory read operation. In the embodiment shown, the column decoder 16 includes a bit line multiplexer (not shown) for selecting a subset of the bit lines (BL0-BLN) and a source line multiplexer (not shown) for selecting a subset of the source lines (SL0-SLN) during a memory operation. The control signals for decoder 16 are provided by controller 20 and are based on a second portion of the ADDRESS received by controller 20.

The column decoder 16 selects K+1 number of selected bit lines and selected source lines from a total number of (N+1) bit lines and source lines of array 12 based on a second portion of the ADDRESS received by controller 20 for the memory operation. In some embodiments, K+1 represents the size of the data unit (e.g. 8, 16, 32, 64 bits) being written to or read from memory array 12 during a memory operation. In other embodiments, K+1 may include multiple data units (e.g. 128 bits, 256 bits) in a row. (N+1)/(K+1) represents the decode ratio (e.g. 4 to 1, 8 to 1, 16 to 1) of column decoder 16.

During a write operation, the selected source lines and selected bit lines are coupled to write driver circuits (43, 44) via mux transistors (not shown in FIG. 1) in column decoder 16 and via source data lines (SDL0, SDLK) and bit data lines (BDL0, BDLK). In one embodiment, during a write operation to a bit cell of a column, a write driver (e.g. 43) couples the bit line (e.g. BL0) of the column to one write voltage of a high write voltage level or a low write voltage level and couples the source line (e.g. SL0) of the column to the other write voltage of the high write voltage level or the low write voltage level, depending on the data value being written as determined by the data lines (D0-DK) and complementary data lines (*D0-*DK). During a write operation, the select transistor (e.g. 23) is made conductive by assertion of the appropriate word line to provide a voltage differential across the resistive storage element (e.g. 34) whose polarity determines whether a HRS or LRS is written to the cell.

In the embodiment shown, during a read operation, the selected source lines are provided to sense amplifiers 45 and 46 via mux transistors (not shown in FIG. 1) in column decoder 16 and via the source data lines (SDL0, SDLK). Each sense amplifier provides a read value from the cell to a data line (D0-DK). The sense amplifiers (45, 46) compare the resistance of a memory cell with a reference resistance (REF) from reference resistance circuit 47 to determine whether the memory is at a HRS (e.g. storing a "1") or a LRS (e.g. storing a "0"). In one embodiment, a portion of the reference resistance is stored in a memory cell of array 12. In the embodiment shown, the reference resistance (REF) is programmable.

In the embodiment shown, memory circuit 10 includes circuitry for setting a level of a write parameter at a desired level to provide a write strength that is just strong enough to write effectively and not overly strong so as to unnecessarily decrease the useable lifetime of the memory cells. Write parameter controller 31 controls the operations of memory circuit 10 in performing a diagnostic routine to determine a desired level of a write parameter. In the embodiment shown, controller 31 includes a table for associating write parameter levels with write efficiency (WE) values of array 12 during weak write operations. The write parameter levels may also be associated in table 33 with a resistance (STR) of a select transistor of array 12 as determined by a select transistor test circuit 42.

Write parameter controller 31 includes a register 35 that stores the selected write parameter level from table 33 associated with the values of WE and STR determined during a diagnostic routine. In the embodiment shown, controller 31 provides a WVC signal that is indicative of the selected level in register 35 to write voltage regulator circuit 37 to set the write voltage applied to a cell by a write driver during a write operation. In the embodiment shown, regulator circuit 37 provides signal WV for setting a write voltage to a cell by a write driver (43 and 44) for writing to the cell during a write operation. In other embodiments (not shown), regulator circuit 37 would provide one signal to the write drivers for setting a write voltage to a cell for writing to a LRS during a write operation and a second signal to the write drivers for setting a second write voltage to a cell for writing to a HRS during a write operation. In some embodiments, these two signals from regulator circuit 37 would be based on the WVC signal.

Controller 31 controls controller 20, reference resistance circuit 47, and threshold detector circuit 36 to perform memory operations to determine the midpoint resistance of a memory state for array 12. In one embodiment, the midpoint resistance is determined by controller 20 placing a selected set of memory cells (e.g. 20%, 50%, or 100% of the memory cells) of array 12 in a LRS during multiple write operations. Afterwards, those cells are read multiple times where each time, a different reference resistance (REF) (as controlled by controller 31) over a range of possible LRS reference resistances is supplied to the sense amplifiers 45 and 46 for the read. Those read values are provided by sense amplifiers 45 and 46 to threshold detector 36, which determines the midpoint resistance of the low memory state (RP50%) from those values.

In one embodiment, the midpoint resistance RP50% is an average resistance of the selected cells of array 12 at a LRS. In other embodiments, the midpoint resistance is a resistance indicated by a particular REF value in which an approximately an equal number of cells have a resistance above the resistance indicated by a particular REF value as below the resistance indicated by the particular REF value. In one embodiment, the midpoint resistance RP50% is a median resistance of the selected cells of array 12. In other embodiments, the midpoint resistance would be determined for cells in a HRS.

Controller 31 also controls controller 20 and threshold detector circuit 36 to perform a write efficiency test to determine a number of cells that were successfully written to a memory state versus the total number of cells on which the write operation was performed. In one embodiment, the write efficiency test begins with all of the selected bits of the test being written to a high resistance state. Then the selected bits are written in a weak write operation to a low resistance state. Threshold detector circuit 36 counts the number of bits that were successfully written versus the total number of selected bits read and provides an indication of the percentage (WE) of the bits that were successfully written to controller 31. In one embodiment, circuit 36 includes a counter for counting the successfully written bits during the write operation. In other embodiments, the bits would be first written to a low resistance state and then written to a high resistance state during a weak write operation for the write efficiency test.

In one embodiment where the write parameter being adjusted is a write voltage being applied to a memory cell, the weak write operation is performed at a lower write voltage than would be typically applied during a write operation. For example, where the write operation voltage is typically 1.4, a voltage of 0.9 would be applied to the cells. In embodiments where the write parameter is write current, where the typical write operation current is 60 µA, a write operation current of 30 µA would be applied during a weak write.

Controller 31 also controls select transistor test circuit 42 to perform a test to determine the resistance of a select transistor in array 12. The test is performed by circuit 42 in response to an enable signal (STEN) signal from controller 31. In response, circuit 42 provides an indication (STR) of the select transistor resistance.

Memory circuit 10 may have other configurations in other embodiments. For example, controller 31 may be integrated with controller 20. Detector circuit 36 and/or test circuit 42 may be integrated or may be integrated with controller 31. Circuit 36 may implemented with two different circuits. Memory circuit 10 may have other configurations, circuits, and/or may operate in other ways. Array 12 may also include other types of resistive memory cells in other embodiments.

Figure 2:
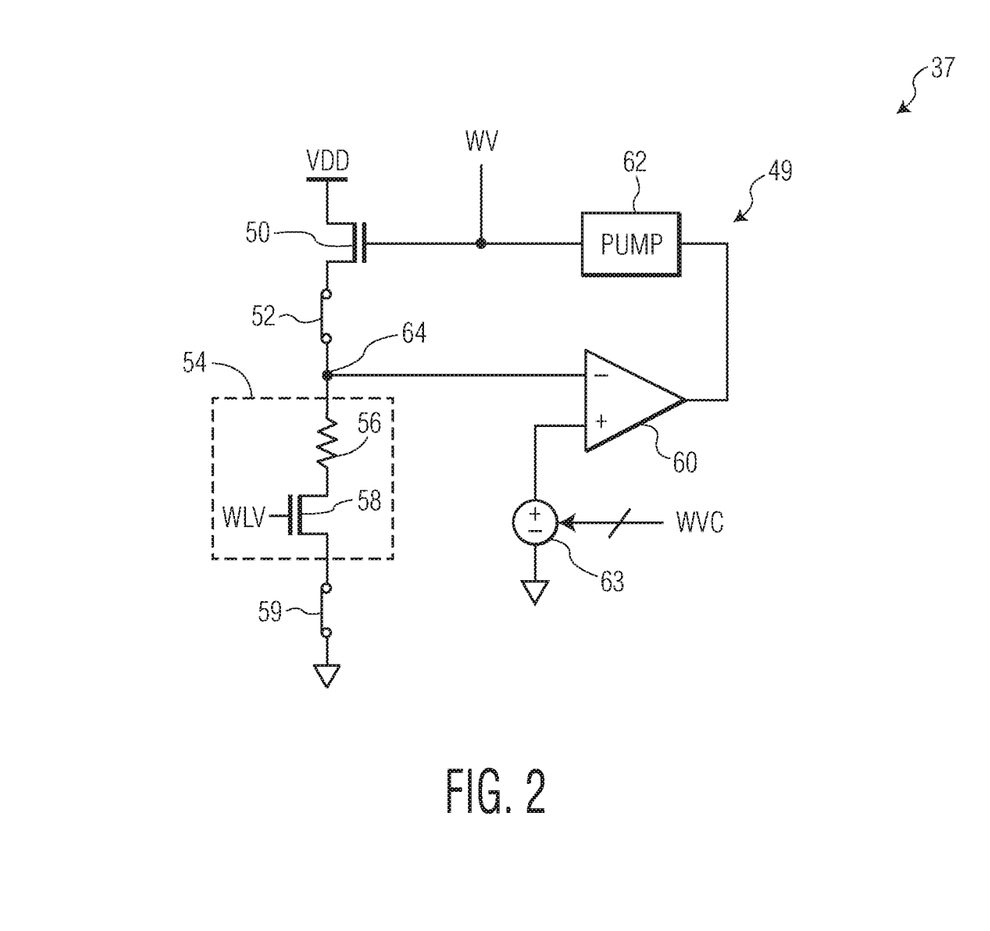
FIG. 2 is a circuit diagram of a write voltage regulator circuit according to one embodiment of the present invention.

FIG. 2 is a circuit diagram of a voltage regulator circuit 37 according to one embodiment. Regulator circuit 37 includes regulator 49. Regulator 49 provides a write voltage control signal (WV) to the write drivers (43, 44) during a write operation for writing memory cells from one state to another. Regulator 49 includes an amplifier 60, charge pump 62, transistor 50, switch 52, replica cell 54, switch 59, and programmable voltage source 63. Replica cell 54 includes resistor 56 which replicates a resistance of a memory cell of array 12 and transistor 58 which replicates a select transistor whose gate is biased with an asserted word line voltage (WLV). Switches 52 and 59 emulate closed switches of column decoder 16. Transistor 50 is the same size as a transistor (see transistor 81 of FIG. 3) of a write driver.

During operation, controller 31 provides an indication (WVC) of a desired write voltage to programmable voltage source 63 such that programmable voltage source produces the desired voltage. The output of amplifier 60 turns on charge pump 62 when the voltage of node 64 falls below the desired voltage such that output voltage WV is placed at a level to control the conductivity of transistor 50 at a level to regulate node 64 at the desired write voltage.

Other regulators circuits may have other configurations in other embodiments. For example, in some embodiments, a regulator circuit may include two regulators. One regulator would provide a write voltage control signal to the write drivers for writing cells from a LRS to a HRS and the other regulator would provide a second write voltage control signal to the write drivers for writing cells from a HRS to a LRS. Also, in some embodiments, the regulators of a regulator circuit may be of different configurations (e.g. having different nodes regulated). Also, in some embodiments, other transistors may be controlled (e.g. a select transistor, a column decoder mux transistor) to provide a regulated voltage to a memory cell.

Figure 3:
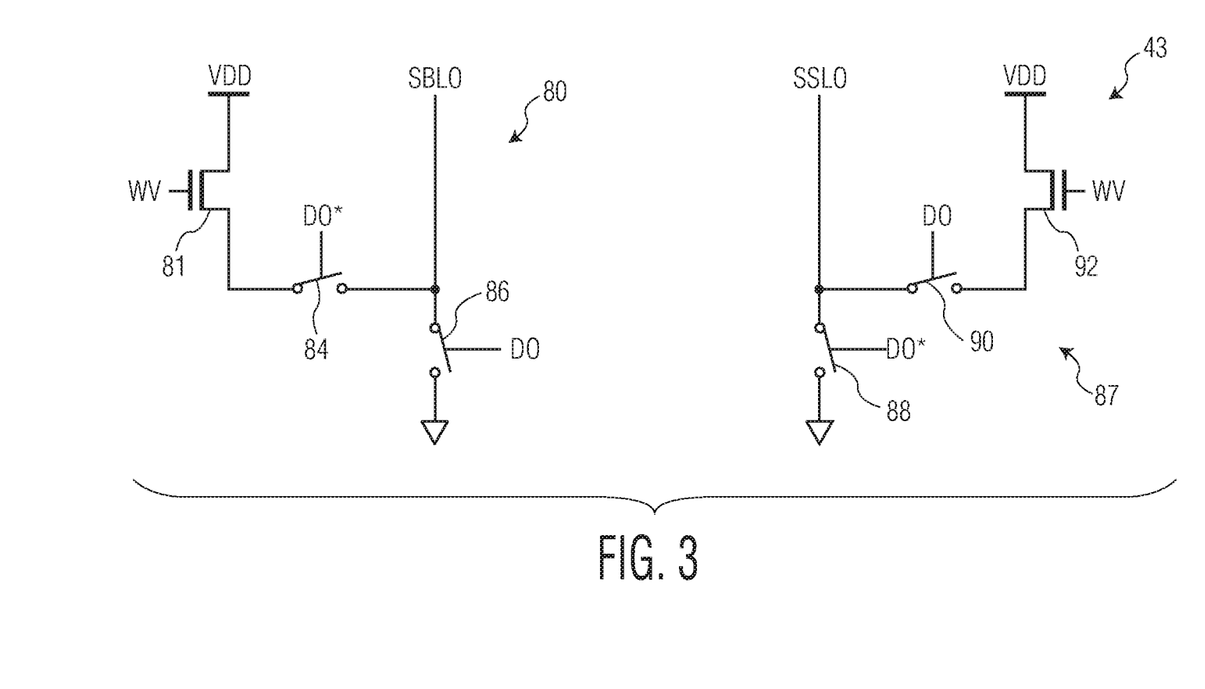
FIG. 3 is a circuit diagram of a write driver circuit according to one embodiment of the present invention.

FIG. 3 is a circuit diagram of write driver circuit 43 according to one embodiment. In the embodiment shown, write driver circuit 43 includes driver 80 for providing a write voltage to write a cell from a HRS to a LRS. Driver circuit 43 also includes a driver 87 for writing a cell from a LRS to a HRS. Driver 80 is connected to bit data line (SBL0). When data value D0 is low indicating that a 0 (corresponding to a LRS in the embodiment shown) is to be written to the cell, D0* being an opposite voltage value causes switch 84 closes to connect transistor 81 to SBL0. D0 being low causes switch 86 to open. In this configuration, WV controls the conductivity of transistor 81 to set the write voltage applied to the memory cell (not shown) at the desired write voltage.

Figure 4:
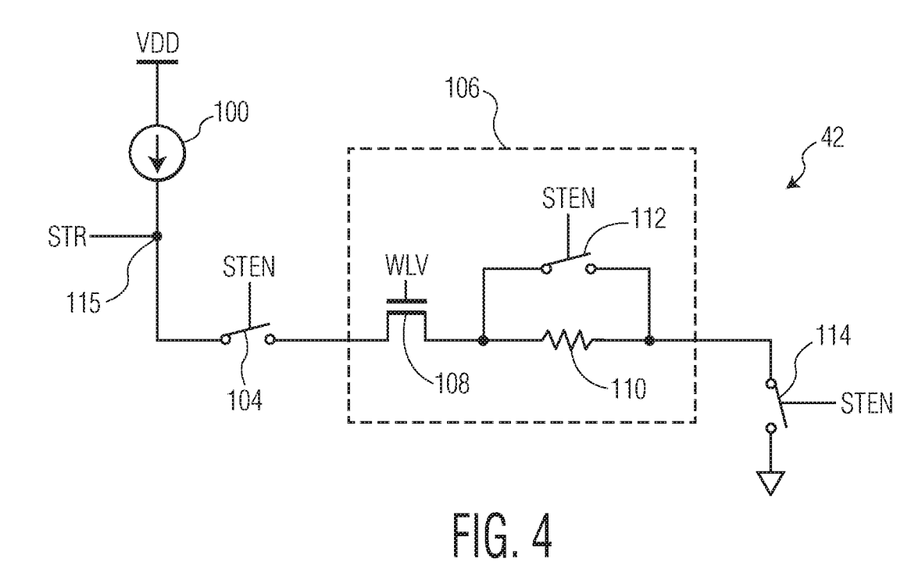
FIG. 4 is a circuit diagram of a select transistor test circuit according to one embodiment of the present invention.

FIG. 4 is a circuit diagram of select transistor test circuit 42 according to one embodiment. Test circuit 42 includes a current source 100, switch 104 that is controlled by the STEN signal, and switch 114 that is controlled by the STEN signal. When the STEN signal is closed, current from current source 100 flows through a cell 106 located in array 12. In the embodiment shown, cell 106 includes a bypass transistor 112 that is closed for the current to bypass MJT 110 during the test. During this time, an asserted word line voltage (WLV) is applied to the gate of transistor 108 to make it conductive. Accordingly, the voltage (STR) at node 115 provides an indication of the resistance of select transistor 108 in the conductive state. In some embodiments, either circuit 42 or controller 31 includes an analog to digital (ADC) converter (not shown) for providing a digital representation of the STR voltage.

In other embodiments, a test circuit may have other configurations. In some embodiments, the test circuit may test more than one select transistor. For example, it could connect a number (e.g. 20) of select transistors in parallel and provide a current through the path.

Figure 5:
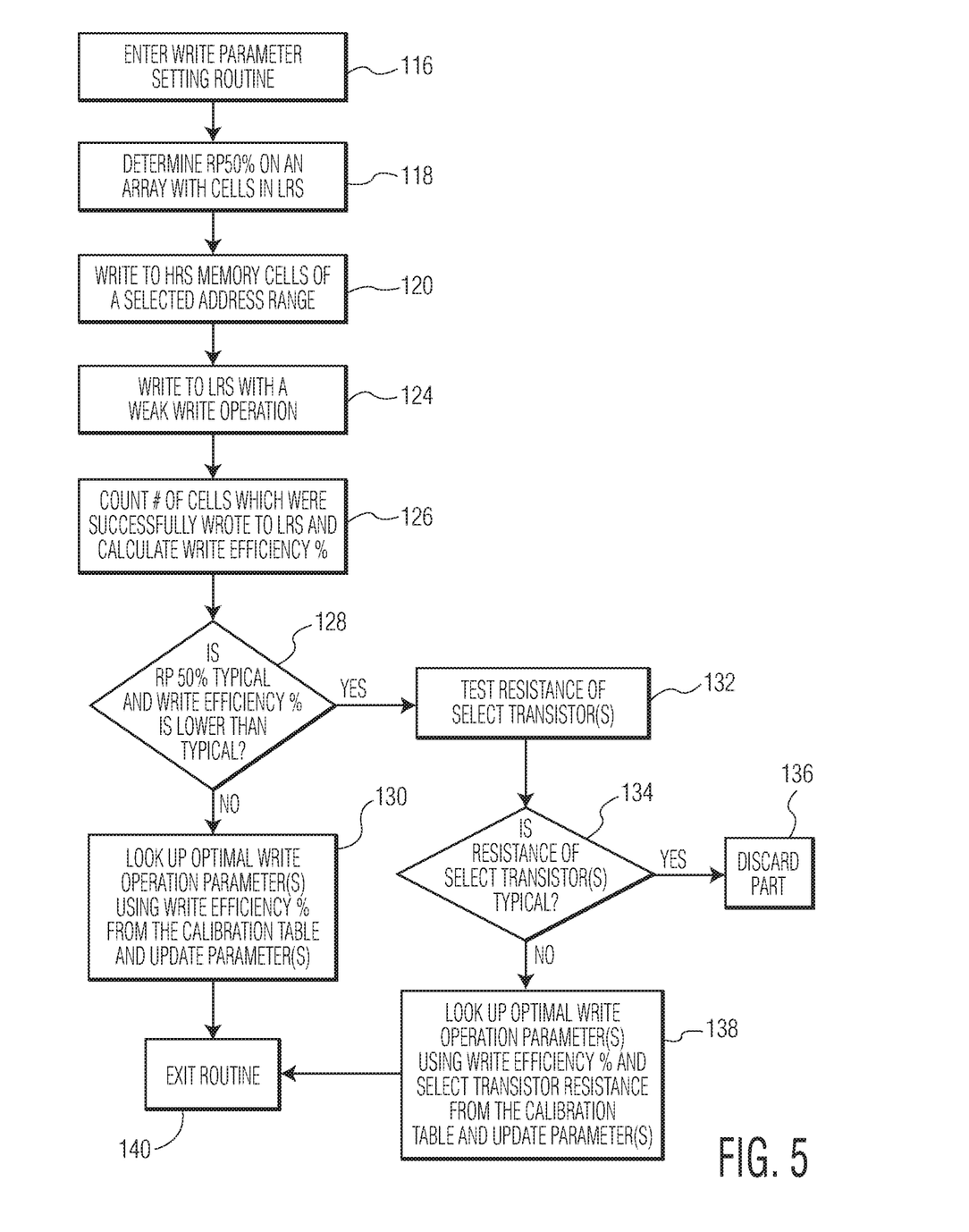
FIG. 5 is a flow diagram of a write parameter setting routine according to one embodiment of the present invention.

FIG. 5 is a flow diagram of a write parameter setting routine that sets a write parameter based on midpoint resistance, write efficiency, and select transistor resistance according to one embodiment. In operation 116, memory circuit 10 enters the write parameter setting routine. In one embodiment, the routine is entered after manufacture but before the part is shipped to a system manufacture for implementation. In other embodiments, the routine may be entered during system manufacture. In other embodiments, the routine may be periodically entered throughout the life of the part so that the write voltage (or current) and be adjusted to account for the effects of aging and memory usage on the cells.

In operation 118, memory circuit 12 determines the midpoint resistance RP50% of the cells of array 12 in the LRS. In one embodiment, the midpoint resistance is determined by a process described above with respect to FIG. 1.

Operations 120, 124, and 126 are for determining a write efficiency of a weak write operation to memory cells of array 12. In operation 120, selected cells of array 12 are written to a HRS state. In one embodiment, the selected cells are in a specific memory range of array 12. In other embodiments, the selected cells are located at different portions of the memory array. In some embodiments, all of the cells of the array are to be tested.

In operation 124, a weak write is performed to write to a LRS the cells that were written to in operation 120. In one embodiment, the weak write operation is implemented by applying a lower write voltage than would typically be applied to the cells to write to an LRS. For example, a typical write voltage applied to a cell to write to a LRS is 1.4V wherein a write voltage of 0.9V is applied to a cell for a weak write operation to an LRS in operation 124. In other embodiments, a weak write operation may be performed by writing with a lower current than is typically used to perform a write.

In operation 126, the number of cells that were successfully written to the LRS is counted by detector circuit 36 in response to read operations of the selected cells. Circuit 36 then calculates a write efficiency of the weak write (number of bits successfully written versus total number of bits). In some embodiments, the write efficiency may be calculated from the cells that were not successfully written.

In decision 128, a determination is made whether RP50% is within a typical range and whether the write efficiency is lower than typical. If so, then the resistance of a select transistor is measured in operation 132 by test circuit 42. If the resistance is observed to be typical as set forth in decision 134, then the part is discarded as being deficient for having a compromised write endurance reliability.

If no in decision 134, then in operation 138, controller 31 looks up in table 33 the write parameters based on the write efficiency and the select transistor resistance and updates register 35 with the selected level or levels. In the embodiment shown, a write voltage level is selected for writing to a memory cell. In other embodiments, a write voltage level is selected for writing from a LRS to a HRS and a write voltage level is selected from writing from a HRS to a LRS.

If no in decision 128, then in operation 130, controller 31 looks up in table 33 the write parameters based on the write efficiency and updates register 35 with the selected level or levels.

In some embodiments, the parameter value levels in table 33 may be selected using other factors such as the midpoint resistance. Other routines may be performed with other operations in other embodiments.

Figure 6:
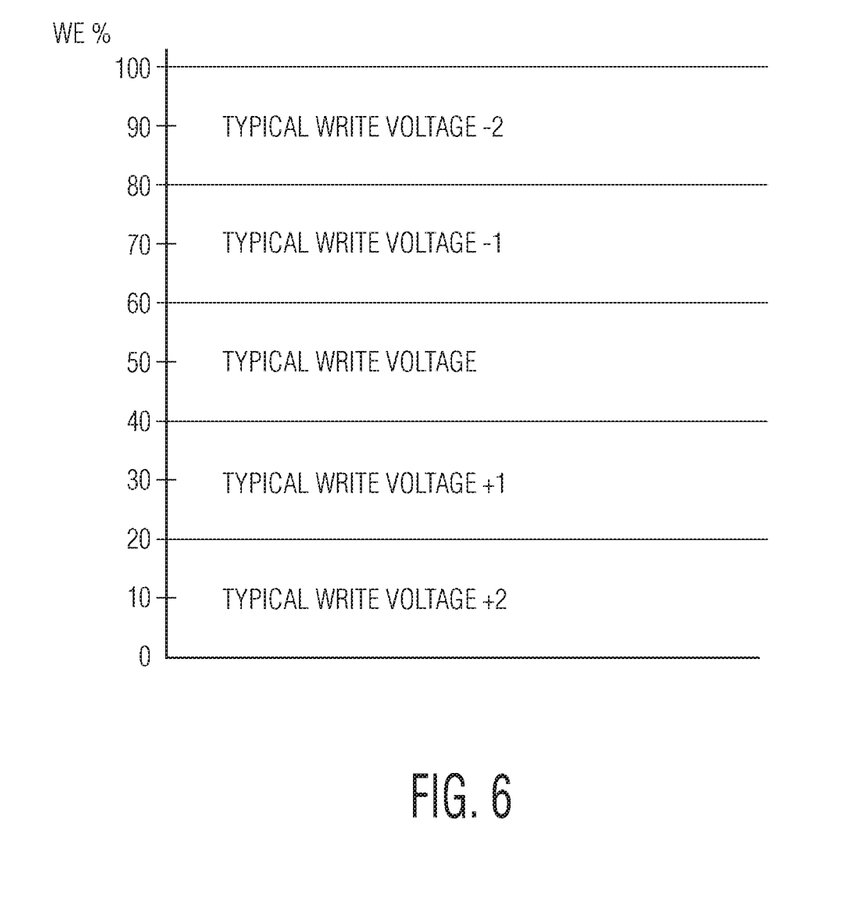
FIG. 6 is a graph showing write voltage ranges corresponding to measured write efficiencies according to one embodiment of the present invention.

FIG. 6 is a graph showing the relationship between the write parameter voltage levels and the measured write efficiency levels of the weak write operation according to one embodiment. In the embodiment shown, five write voltages are available to be used for write operations. The write voltage selected depends upon the measured write efficiency of the weak write operation. In the embodiment shown, if the write efficiency falls between 40% and 60%, then the typical write voltage is used (e.g. 1.2 volts) for subsequent write operations. If the write efficiency is higher than 60%, the then write voltage is reduced to increase the life of the memory cells. As shown in the graph, for write efficiency values between 60-80%, the write voltage is decreased by one increment (e.g. by 0.2 volts). If the write efficiency is above 80%, then the write voltage is decreased by two increments (e.g. by 0.4 volts).

If the write efficiency of the weak write operation is lower than 40%, then the write voltage is increased to improve the efficiency of the write operations. If the write efficiency is between 20-40%, then the write voltage is increased by one increment (e.g. by 0.2 volts). If the write efficiency is less than 20%, the write voltage to be used will be increased by two increments (e.g. by 0.4 volts).

In other embodiments, there may be a greater or lesser number of write voltage increments available. Also, the write efficiency ranges may be different in other embodiments as well. In other embodiments, the selected write voltage may be dependent on other variables such as e.g. midpoint resistance and/or select transistor resistance.

In one embodiment, providing a memory having resistive memory cells with the capability to set write parameters based on a midpoint resistance and a write efficiency may provide a for a memory whose write parameters can be adjusted to account for the effects of different types of process variations and for aging. Such an adjustment may be made using more simplified tests that can be formed on chip and during usage.

The switches shown in the figures (e.g. switches 84, 104) may be implemented with a number of switching devices such as e.g. bipolar transistors, MOSFETS, pass gates, etc.

The circuitry, features, and/or methods described with respect to one embodiment may be implemented with the circuitry, features, and/or methods of the other embodiments.

In one embodiment, a method for operating a memory includes determining a midpoint resistance of a memory state for resistive memory cells of a memory array of resistive memory cells and performing a write to memory cells of the memory array to a first value state. The write is performed at a first level of a write parameter. The method includes determining a write efficiency of the write to the memory cells to the first value state and setting a level of the write parameter based on the write efficiency and the midpoint resistance.

In another embodiment, a method for operating a memory includes determining a midpoint resistance of a memory state for resistive memory cells of a memory array of resistive memory cells and performing a write to memory cells of the memory array to a first value state. The write is performed with write operations that are characterized as weaker write operations than a typical write operation. The method includes determining a write efficiency of the write to the first value state and setting a level of a write parameter for subsequent write operations to the resistive memory cells based on the write efficiency and the midpoint resistance.

In another embodiment, a memory includes a memory array of resistive memory cells, write circuitry for writing values to memory cells of the memory array as per a write parameter, and write parameter circuitry. The write parameter circuitry is configured to determine a midpoint resistance of a memory state for resistive memory cells of the memory array, determine a write efficiency of a write of memory cells of the memory array to a first value state with the write parameter being at a first level, and set the write parameter to a set level based on the write efficiency and the midpoint resistance.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method for operating a memory, comprising:
   determining a midpoint resistance of a memory state for resistive memory cells of a memory array of resistive memory cells;
   performing a write to memory cells of the memory array to a first value state, the write being performed at a first level of a write parameter;
   determining a write efficiency of the write to the memory cells to the first value state, wherein the write efficiency is an indication of the number of the memory cells successfully written to the first value state in the performing the write to the memory cells to the first value state versus the total number of the memory cells that were written to in the performing the write;
   setting a level of the write parameter based on the write efficiency and the midpoint resistance.

2. The method of claim 1 wherein the write parameter is a voltage applied to a memory cell during a write operation.

3. The method of claim 2 wherein the setting a level of the write parameter includes setting a level of the voltage applied to a memory cell during a write operation at a higher voltage level if the write efficiency is less than a first value or a lower voltage level if the write efficiency is greater than the first value.

4. The method claim 2 wherein the first level of the write parameter is lower than a typical voltage level applied to the memory cell during a write operation.

5. The method of claim 1 wherein the write parameter is a current applied to a memory cell during a write operation.

6. The method of claim 1 wherein the midpoint resistance of a memory state is a resistance value in which approximately a same number of memory cells of the memory array have a resistance above the resistance value as a number of memory cells of the memory array have a resistance below the resistance value when the memory cells are programmed to a same memory state.

7. The method of claim 6 where the same memory state is a low resistance state of the memory cells.

8. The method of claim 1 wherein the first value state is a low resistance state of the memory cells.

9. The method of claim 1 wherein setting a level further comprises:
   determining a resistivity of a select transistor of the memory array in a conductive state.

10. The method of claim 9 wherein the determining a resistivity is performed if the midpoint resistance is within a typical range and the write efficiency is below a typical range.

11. The method of claim 1 wherein the first level of a write parameter is set such that a write operation as per the first level of the write parameter is characterized as a weaker write operation than a typical write operation.

12. The method of claim 1 further comprising:
   performing a write operation to a group of memory cells of the memory array, the write operation being performed at the level of the write parameter set by the setting.

13. The method of claim 1 wherein the determining the midpoint resistance includes placing of at least a portion of the plurality of memory cells in the memory state and reading the at least a portion of the plurality of memory cells in the memory state to determine their resistance.

14. A method for operating a memory, comprising:
   determining a midpoint resistance of a memory state for resistive memory cells of a memory array of resistive memory cells;
   performing a write to memory cells of the memory array to a first value state, wherein the write is performed with write operations that are characterized as weaker write operations than a typical write operation;
   determining a write efficiency of the write to the first value state;
   setting a level of a write parameter for subsequent write operations to the resistive memory cells based on the write efficiency and the midpoint resistance.

15. A memory comprising:
    a memory array of resistive memory cells;
    write circuitry for writing values to memory cells of the memory array as per a write parameter;
    write parameter circuitry, the write parameter circuitry configured to determine a midpoint resistance of a memory state for resistive memory cells of the memory array, determine a write efficiency of a write of memory cells of the memory array to a first value state with the write parameter being at a first level, wherein the write efficiency is an indication of the number of a group of memory cells of the memory array that are successfully written to the first value state in a performance, by the write circuitry, of a write to the group of memory cells to the first value state with the write parameter being at a first level versus the total number of the group of memory cells that are written to in the performance of the write; and set the write parameter to a set level based on the write efficiency and the midpoint resistance.

16. The memory of claim 15 wherein the write parameter is a write voltage applied to a memory cell during a write operation.

17. The memory of claim 16 wherein the write parameter is a voltage applied to a memory cell during a write operation to the first value state.

18. The memory of claim 16 wherein the first level is a write voltage level that is less than a typical write voltage for the memory array.

19. The memory of claim 16 wherein the write circuitry includes a circuit for adjusting the write voltage to a voltage level as set by the write parameter circuitry.

20. The memory of claim 15 wherein the write parameter circuitry is configured to determine a resistivity of a select transistor of the memory array in a conductive state.

21. The memory of claim 15 wherein the first level of the write parameter is set such that a write operation as per the first level of the write parameter is characterized as a weaker write operation than a typical write operation of the memory array.

22. The memory of claim 15 wherein the write parameter is a write current applied to a memory cell during a write operation.

* * * * *